(12) United States Patent
Talledo

(10) Patent No.: US 6,664,838 B1
(45) Date of Patent: Dec. 16, 2003

(54) APPARATUS AND METHOD FOR GENERATING A COMPENSATED PERCENT-OF-CLOCK PERIOD DELAY SIGNAL

(75) Inventor: Cesar A. Talledo, Sunnyvale, CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 10/094,101

(22) Filed: Mar. 8, 2002

Related U.S. Application Data

(60) Provisional application No. 60/316,399, filed on Aug. 31, 2001.

(51) Int. Cl.[7] .................................... H03H 11/26
(52) U.S. Cl. ........................ 327/277; 327/284
(58) Field of Search ................. 327/158, 276, 327/273, 277, 279, 284, 286

(56) References Cited

U.S. PATENT DOCUMENTS

| | | | | |
|---|---|---|---|---|
| 5,561,692 A | * | 10/1996 | Maitland et al. | 375/371 |
| 6,194,937 B1 | * | 2/2001 | Minami | 327/270 |
| 6,288,574 B1 | * | 9/2001 | Neary | 327/12 |
| 6,313,621 B1 | * | 11/2001 | Zwack | 324/76.52 |
| 6,313,676 B1 | * | 11/2001 | Abe et al. | 327/158 |

OTHER PUBLICATIONS

Ryan, Kevin, "DDR SDRAM Functionality and Controller Read Data Capture," DesignLine, Micron Technology, Inc., vol. 8, Issue 3, 3Q99.

* cited by examiner

Primary Examiner—Timothy P. Callahan
Assistant Examiner—Cassandra Cox
(74) Attorney, Agent, or Firm—Victor H. Okumoto, Esq.

(57) ABSTRACT

An apparatus and method for generating a compensated percent-of-clock period delay signal are described. A first circuit determines how many delay elements a clock signal passes through during one period of the clock signal. A second circuit passes a signal to be delayed through the same number of delay elements according to information received from the first circuit. The ratio of the values of delay elements in the first and second circuits determines the percent-of-clock period that the passed signal is delayed. Since the clock signal is relatively insensitive to reference voltage and temperature variations as compared to the delay elements, the percent-of-clock period is maintained as more or less delay elements are passed through during a period of the clock signal.

54 Claims, 2 Drawing Sheets

APPARATUS AND METHOD FOR GENERATING A COMPENSATED PERCENT-OF-CLOCK PERIOD DELAY SIGNAL

CROSS REFERENCE TO RELATED APPLICATIONS

This application claims priority to U.S. provisional application Ser. No. 60/316,399 filed Aug. 31, 2001.

FIELD OF THE INVENTION

The present invention generally relates to electrical delay lines and in particular, to an apparatus and method for generating a compensated percent-of-clock period delay signal.

BACKGROUND OF THE INVENTION

Compensated percent-of-clock period delay signals are useful in many applications. As an example, such a delayed data strobe signal (DQS) is useful for capturing read data (DQ) provided along and edge-aligned with the DQS from a double data rate (DDR) synchronous dynamic random access memory (SDRAM).

The benefits of DDR SDRAMs are well known. Simply put, DDR SDRAMs are probably the most straightforward and least costly approach to doubling memory data bandwidth over the single data rate SDRAMs in common use today.

Read data capture at the memory controller, however, can be a significant challenge using DDR SDRAMs. To assist in read data capture, the DDR SDRAM provides one or more bQS that are edge-aligned with corresponding DQ provided by the DDR SDRAM during a read operation. To capture the data, the memory controller internally delays the received DQS to be within a data valid window, and then captures the DQ using the thus delayed DQS.

The optimal delay for DQS is the average location of the center of the data valid window, taking into account the maximum skew between DQS, DQ (DQSQ") and the reduced data valid window (DV") realized at the memory controller. DQSQ" in this case is the sum of the nominal skew between any data line and its corresponding DQS at the pins of the DDR SDRAM (DQSQ) plus skew additions that are incurred between the DDR SDRAM and the memory controller. For example, in a system where the memory controller is on a separate chip than the DDR SDRAM, such skew additions include board effects between the DDR SDRAM and the chip, and internal routing within the chip. Likewise, DV" in this case is the nominal DDR SDRAM data valid window at the pins of the DDR SDRAM (DV)reduced by the skew additions.

A percent-of-clock period delay is only one possible approach for implementing the DQS delay for read data capture. Other approaches include using a predetermined absolute delay value or a selectable delay. Each of these implementations, however, is susceptible to process, voltage and temperature variations that may significantly alter the value of their delay line. Such variations may destroy the limited timing budget available for read data capture. Thus, most systems could benefit from a delay implementation that addresses one or more of these error-producing variations.

Delay locked loops (DLLs) have been proposed to compensate for at least reference voltage and temperature variations in the predetermined absolute delay value and selectable delay implementations. A DLL locked to the clock is also thought to be required in a percent-of-clock period delay implementation. However, multiple clock periods are generally required for the DLL to "lock" in these implementations, thereby objectionably adding to the effective read access time in short burst read data captures.

OBJECTS AND SUMMARY OF THE INVENTION

Accordingly, it is an object of the present invention to provide an apparatus and method for generating a compensated percent-of-clock period delayed signal that does not require a DLL.

Another object is to provide an apparatus and method for generating a compensated percent-of-clock period delayed signal that compensates for reference voltage and temperature variations.

Another object is to provide an apparatus and method for generating a compensated percent-of-clock period delayed signal that completes its compensation within one clock period.

Still another object is to provide an apparatus and method for generating a compensated percent-of-clock period delayed signal that is cost effective and simple to implement.

These and additional objects are accomplished by the various aspects of the present invention, wherein briefly stated, one aspect is an apparatus for generating a compensated percent-of-clock period delayed signal. The apparatus includes a first circuit that generates an output that is indicative of a number of a first plurality of serially coupled delay elements. Individual of such first plurality of serially coupled delay elements have substantially a first delay value. Together, they provide a combined delay related to a period of a clock signal. The apparatus also includes a second circuit that is coupled to the first circuit. The second circuit generates a delayed signal by passing a signal to be delayed through a second plurality of serially coupled delay elements. Individual of such second plurality of serially coupled delay elements have substantially a second delay value. Together, they are related in number to the number of the first plurality of serially coupled delay elements.

Another aspect is a method for generating a compensated percent-of-clock period delayed signal, comprising: determining a first number of serially coupled first delay elements having a combined delay substantially equal to a period of a clock signal; and generating a delayed signal by passing a signal through a second number of serially coupled second delay elements, wherein the second number is determined from the first number and the delayed signal is delayed from the signal by a percentage of the period of the clock signal according to values of the first number, the second number, the first delay elements, and the second delay elements.

Still another aspect is an apparatus for generating a compensated percent-of-clock period delayed signal. The apparatus includes a first delay tree that is sensitive to reference voltage and temperature variations. The first delay tree has branches that receive and delay by varying amounts, a clock signal that is relatively insensitive to the reference voltage and temperature variations as compared to the first delay tree. The apparatus also includes a processing circuit that captures outputs of the first delay tree in response to the clock signal so as to indicate a first set of branches of the first delay tree through which the clock signal has passed and a second set of branches of the first delay tree through which the clock signal has not passed during a period of the clock signal. The apparatus further includes a second delay tree similarly sensitive to the reference voltage and temperature variations as compared to the first delay tree. The second delay tree also has branches that receive and delay by varying amounts a signal to be delayed. The apparatus also includes a selection circuit that selects an output of one of the branches of the second delay tree to provide a delayed signal compensated for the reference voltage and temperature variations according to information of the captured outputs of the first delay tree.

Additional objects, features and advantages of the various aspects of the present invention will become apparent from the following description of its preferred embodiment, which description should be taken in conjunction with the accompanying drawings.

DETAILED DESCRIPTION OF THE PREFERRED EMBODIMENT

Figure 1:
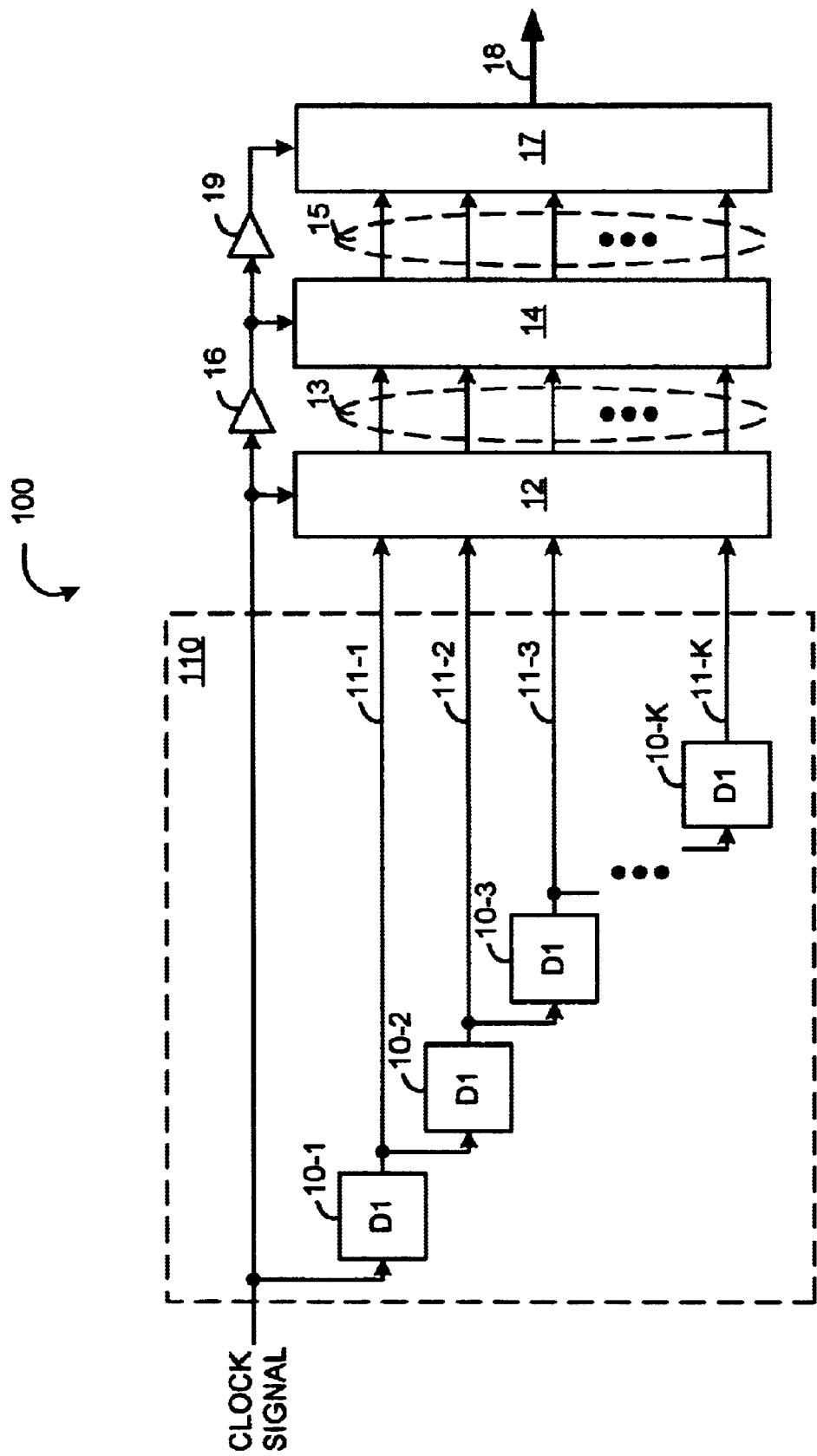
FIG. 1 illustrates, as an example, a first circuit as part of an apparatus for generating a compensated percent-of-clock period delayed signal, utilizing aspects of the present invention.

FIG. 1 illustrates, as an example, a first circuit 100 as part of an apparatus for generating a compensated percent-of-clock period delayed signal. A first delay tree 110 has K delay branches 11-1 to 11-K that are sequentially configured so as to have increasing numbers of serially coupled first delay elements individually of substantially a first delay value D1, so that each of the branches provides incrementally more delay than a previous branch in sequence. In particular, in the first delay tree 110, a first delay branch 11-1 includes a single delay element 10-1, a second delay branch 11-2 includes two delay elements 10-1 and 10-2, a third delay branch 11-3 includes three delay elements 10-1, 10-2, and 10-3, and so on, down to a K-th delay branch 11-K that includes K delay elements 10-1 to 10-K.

A clock signal is provided to each of the delay branches 11-1 to 11-K through their common delay element 10-1, to an enable input of a first register 12, and to a buffer 16. Outputs of the delay branches 11-1 to 11-K are coupled to corresponding inputs of the first register 12. The first register 12 is enabled to capture values on the outputs of the delay branches 11-1 to 11-K on rising edges of the clock signal. Consequently, a low logic state is captured on the output 13 for each delay branch through which the previous rising and falling edges of the clock signal have passed through when the subsequent rising edge of the clock signal enables the first register 12; a high logic state is captured on the output 13 for each delay branch through which the previous rising edge of the clock signal has passed through, but the falling edge has not passed through yet when the subsequent rising edge of the clock signal enables the register 12; and a low logic state is captured on the output 13 for each delay branch through which the previous rising edge of the clock signal has not passed through yet when the subsequent rising edge of the clock signal enables the register 12. Thus, the output 13 of the first register 12 is indicative of the number of serially coupled delay elements through which a rising edge of the clock signal has passed through during one period of the clock signal.

The delay elements 10-1 to 10-K are generally sensitive to reference voltage and temperature variations.

The clock signal, on the other hand, should be relatively insensitive to such variations. A system clock is generally capable of providing such a clock signal. As a result of such relative sensitivities between the clock signal and delay elements, the number of serially coupled delay elements through which a rising edge of the clock signal passes through during one period of the clock signal changes with reference voltage and/or temperature variations.

A second register 14 has inputs coupled to corresponding outputs of the first register 12 as in a conventional "pipelined" architecture. The second register 14 is also enabled by the clock signal through the buffer 16. Even if one or more of the output 13 are metastable, inclusion of the second register 14 ensures that the second stage output 15 are all stable (i.e., have all settled down to valid logic states).

The second stage output 15 thus results in a "sample vector". An "edge transition" occurs in the sample vector where the bits change logic states (e.g., change from "0s" on one side of the edge transition to "1s" on the other side, or "1s" on one side of the edge transition to "0s" on the other side). A "positive edge transition" in this case, identifies the delay branch (e.g., the last one indicating a "0" or the first one indicating a "1", depending upon which convention is selected), among the delay branches 11-1 to 11-K, that has approximately the same combined delay from its delay elements as the period of the clock signal. Since each of the delay branches 11-1 to 11-K also has a different number of delay elements in it, the positive edge transition also indirectly indicates that number when identifying the branch.

False readings (also referred to herein as "false samples") on one or more of the output 13 and consequently, on corresponding of the output 15 may occur due to the first register 12 latching (also referred to herein as "sampling") certain outputs of the delay branches 11-1 to 11-K that are metastable. Metastability in this case may result if the value in any one of the delay branches 11-1 to 11-K is transitioning during the set-up and hold time of the register 12 when it is being enabled. Factors that determine which one of the branches violates such set-up and hold times include the power supply levels, noise and/or system temperature affecting the value D1 of the delay elements 10-1 to 10-K, the period of a system clock generating the clock signal being affected by jitter and/or its frequency varying from system to system, or the non-zero rise time of the clock signal.

DQS delay control logic ("DDCL") 17 receives the output 15, and processes the sample vector provided thereon to determine the correct edge transition in light of possible false samples. It does this by performing two functions on the sample vector.

First, the DDCL 17 locates the earliest positive edge transition in the sample vector. The earliest or first positive edge transition is located in this case, because the sample vector may contain for some reason more than one period of the clock signal. For example, more than one positive edge transition may occur if the combined delay of the last delay branch 11-K is greater than a period of the clock signal.

Second, the DDCL 17 compares the position of the newly detected positive edge transition with positions of one or more previously detected positive edge transitions of prior clock periods, and modifies its position as necessary to avoid abrupt adjustment position changes between adjacent clock periods. This function is desirable so that the DDCL 17 provides its output 18 in a manner that adjusts smoothly over time for changes in temperature and/or voltage. In particular, it prevents power supply noise from disrupting valid edge transition detections. The following procedure is one method of performing this second function:

```
if (new_posedge_position<=prev_posedge_position-2)
    posedge_position=prev_posedge_position-1;
else if(new_posedge_position=>prev_posedge_
    position+2)
    posedge_position=prev_posedge_position+1;
else
    posedge_position=new_posedge_position;
```

The procedure causes the DDCL 17 to change its output 18 smoothly in response to reference voltage and/or temperature variations by adjusting the located position of the positive edge transition in the sample vector at most one position per clock period. The output 18 in this case indicates the position of the positive edge transition on the sample vector. The position of the positive edge transition, in turn, indicates which one of the delay branches 11-1 to 11-K has a combined delay from its delay elements that most closely approximates the period of the clock signal during a given period of the clock signal at the then prevalent reference voltage and temperature conditions. Although a threshold value of "2" is used in this example, other values may also be used as determined, for example, by trial-and-error to achieve maximal results.

Alternatively, the second function of the DDCL 17 may be performed using a moving average or other averaging technique. Such techniques would not only avoid abrupt changes of the positive edge transition detected between successive clock periods, but would also prevent "drift" errors that might occur using the prior described technique. As a simple example of a moving average technique, the position of the current positive edge transition may be taken as the average of the current and the nine previously determined positions.

Figure 2:
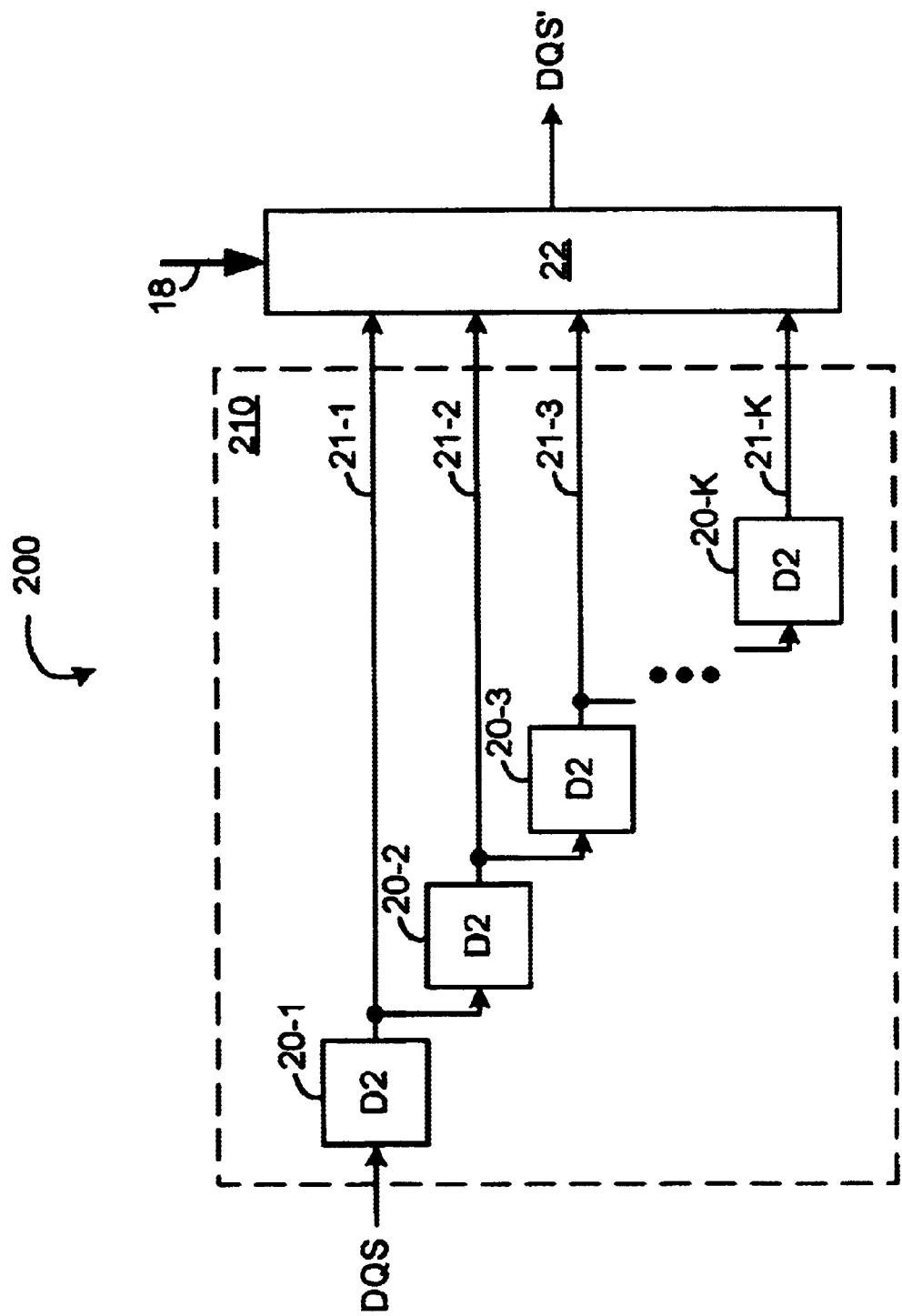
FIG. 2 illustrates, as an example, a second circuit as part of an apparatus for generating a compensated percent-of-clock period delayed signal, utilizing aspects of the present invention.

FIG. 2 illustrates, as an example, a second circuit 200 as part of the apparatus for generating a compensated percent-of-clock period delayed signal. A second delay tree 210 hasK delay branches 21-1 to 21-K that are sequentially configured so as to have increasing numbers of serially coupled second delay elements individually of substantially a second delay value D2, so that each of the branches provides incremental more delay than a previous branch in sequence.

The delay branches 21-1 to 21-K of the second delay tree 210 respectively correspond to the delay branches 11-1 to 11-K of the first delay tree 110, so that the ratio of total delay on corresponding branches equal a desired percent-of-clock period. In the present example, where corresponding branches, such as 11-i and 21-i for i=1, ... K, have the same number of delay elements, the percent-of-clock period is equal to the ratio of their respective delay element values. In such case, where the second delay element D2 has a value that is 20% of that of the first delay element D1, then the percent-of-clock period is also 20%. On the other hand, in another example (not shown), where the first and second delay elements, D1 and D2, are equal in value, then corresponding branches in the first and second delay trees, 110 and 21Q, must have different numbers of delay elements in order for the ratio of total delay on the corresponding branches to be equal to the desired percent-of-clock period. In that case, where the percent-of-clock period is desired to be 20%, the number of delay elements in branches of the first delay tree 110 must be five times as many as their corresponding branches in the second delay tree 210.

A data strobe (DQS) or other signal to be delayed is provided to each of the delay branches 21-1 to 21-K through their common delay element 20-1. Outputs of the delay branches 21-1 to 21-K are coupled to corresponding inputs of a multiplexer 22, and the output 18 of the DDCL 17 of the first circuit 100 is coupled to a select input of the multiplexer 22. Consequently, the output of the branch of the second delay tree 210 that corresponds to the branch of the first delay tree 110 is passed through the multiplexer 22 after being selected according to information on the output 18.

As previously noted, the ratio of total delay on corresponding branches of the first and second delay trees, 110 and 210, equals the desired percent-of-clock period. Therefore, since the total delay on the branch of the first delay tree 110 has been selected such that its delay is approximately equal to the clock period, the total delay on its corresponding branch of the second delay tree 210 is approximately the desired percent-of-clock period. As a result, the output signal DQS' on the output of the multiplexer 22 is the desired percent-of-clock period delayed signal.

In brief summary of FIGS. 1 and 2, the first circuit 100 determines how many delay elements a clock signal passes through during one period of the clock signal. The second circuit 200 then passes a signal DQS to be delayed through the same number of delay elements according to information received from the first circuit 100. The ratio of the values of delay elements in the first and second circuits (i.e., D2/D1) determines the percent-of-clock period that the passed signal is delayed. Since the clock signal is relatively insensitive to reference voltage and temperature variations as compared to the delay elements, 10-1 to 10-K and 20-1 to 20-K, a reasonably constant percent-of-clock period delay is maintained as more or less delay elements are passed through during each successive period of the clock signal.

Although the various aspects of the present invention have been described with respect to a preferred embodiment, it will be understood that the invention is entitled to full protection within the full scope of the appended claims.

I claim:

1. An apparatus for generating a compensated percent-of-clock period delayed signal, comprising:

a first circuit generating an output indicative of a number of a first plurality of serially coupled delay elements individually having substantially a first delay value and together providing a combined delay related to a period of a clock signal, wherein said clock signal is relatively insensitive to reference voltage and temperature variations and said number varies according to said reference voltage and said temperature variations; and a second circuit coupled to said first circuit and generating a delayed signal by passing a signal to be delayed through a second plurality of serially coupled delay elements individually having substantially a second delay value and together related in number to said number of said first plurality of serially coupled delay elements, wherein said signal to be delayed is a data strobe signal received from a DDR SDRAM and said delayed signal is employed for capturing at least one data signal provided by said DDR SDRAM.

2. The apparatus according to claim 1, wherein said combined delay is approximately equal to said period of said clock signal.

3. The apparatus according to claim 1, wherein a second number of said second plurality of serially coupled delay elements is equal to said number of said first plurality of serially coupled delay elements, and a ratio of said first delay value and said second delay value determines how much said delayed signal is delayed from said signal to be delayed as a percent of said period of said clock signal.

4. The apparatus according to claim 1, wherein said first delay value and said second delay value are equal, and a ratio of said number of said first plurality of serially coupled delay elements and a number of said second plurality of serially coupled delay elements determines how much said delayed signal is delayed from said signal to be delayed as a percent of said period of said clock signal.

5. The apparatus according to claim 1, wherein said number of said first plurality of serially coupled delay elements, a number of said second plurality of serially coupled delay elements, said first delay value, and said second delay value are selected such that said delayed signal is delayed from said signal by approximately twenty percent of said period of said clock signal.

6. The apparatus according to claim 1, wherein said first circuit comprises:
   a first plurality of delay branches sequentially configured so as to have increasingly larger numbers of delay elements of said first delay value, said first plurality of delay branches including said first plurality of serially coupled delay elements and individually having an output and an input receiving said clock signal; and
   a first register enabled by said clock signal and having inputs and outputs, said inputs of said first register coupled to corresponding outputs of said first plurality of delay branches such that said outputs of said first register are indicative of said number of said first plurality of serially coupled delay elements.

7. The apparatus according to claim 6, wherein said first circuit further comprises a second register enabled by said clock signal, said second register having inputs and outputs, said inputs of said second register coupled to corresponding outputs of said-first register so that said outputs of said second register are as or more accurately indicative of said number of said first plurality of serially coupled delay elements than said outputs of said first register.

8. The apparatus according to claim 7, wherein said first circuit further comprises a buffer having an input and an output, wherein said buffer input is coupled to said clock signal and said buffer output provides said clock signal to enable said second register.

9. The apparatus according to claim 8, wherein said first circuit further comprises delay control logic receiving and processing said outputs of said second register so as to provide information indicative of said number of said first plurality of serially coupled delay elements to said second circuit.

10. The apparatus according to claim 9, wherein said output of said second register defines a vector having bits among which a first positive edge transition is indicated where a first set of said bits on one side of said edge transition are mostly a first logic state and a second set of said bits on an opposite side of said edge transition are mostly a second logic state so that said number of said first plurality of serially coupled delay elements is indicated by a position of said first positive edge transition in said vector.

11. The apparatus according to claim 10, wherein said delay control logic has a first function of finding said position of said first positive edge transition in said vector.

12. The apparatus according to claim 11, wherein said delay control logic has a second function of adjusting said position of said first positive edge transition in said vector according to at least one previously found position so as to avoid abrupt changes in positions of edge transitions for adjacent periods of said clock signal.

13. The apparatus according to claim 12, wherein said delay control logic performs said second-function using a moving average technique.

14. The apparatus according to claim 1, wherein said second circuit comprises:

a second plurality of delay branches sequentially configured so as to have increasingly larger numbers of delay elements of said second delay value, said second plurality of delay branches including said second plurality of delay elements and individually having an output and an input receiving said signal to be delayed; and a multiplexer having data inputs, a selector input, and an output, wherein said data inputs of said multiplexer are coupled to corresponding outputs of said second plurality of delay branches, said selector input is coupled to said output of said first circuit, and said output of said multiplexer provides said delayed signal.

15. A method for generating a compensated percent-of-clock period delayed signal, comprising:
   determining a first number of serially coupled first delay elements having a combined delay substantially equal to a period of a clock signal, wherein said clock signal is relatively insensitive to reference voltage and temperature variations compared to individual of said serially coupled first delay elements; and
   generating a delayed signal by passing a signal through a second number of serially coupled second delay elements, wherein said signal is a data strobe signal received from a DDR SDRAM, said second number is determined from said first number, and said delayed signal is employed for capturing at least one data signal provided by said DDR SDRAM and is delayed from said signal by a percentage of said period of said clock signal according to values of said first number, said second number, said first delay elements, and said second delay elements.

16. The method according to claim 15, wherein said determining a first number of serially coupled first delay elements having a combined delay substantially equal to a period of a clock, comprises:
   providing said clock signal to a first delay tree having branches sequentially configured so as to have increasing numbers of serially coupled first delay elements; and
   providing outputs of said branches of said first delay tree to a first register enabled by said clock signal and having an output indicative of said number of serially coupled first delay elements.

17. The method according to claim 16, wherein said determining a first number of serially coupled first delay elements having a combined delay approximately equal to a period of a clock signal, further comprises providing said output of said first register to a second register enabled by said clock signal and having an output generally more accurately indicative of said number of serially coupled first delay elements than said output of said first register.

18. The method according to claim 15, further comprising determining said second number of serially coupled second delay elements by processing a vector corresponding to said first number of serially coupled first delay elements, wherein said vector has bits among which a first positive edge transition is indicated where a first set of said bits on one side of said edge transition are mostly a first logic state and a second set of said bits on an opposite side of said edge transition are mostly a second logic state so that said number of said serially coupled first delay elements is indicated by a position of said first positive edge transition in said vector.

19. The method according to claim 18, wherein said processing of said vector corresponding to said first number of serially coupled first delay elements, comprises finding said position of said first positive edge transition in said vector.

20. The method according to claim 19, wherein said determining a first number of serially coupled first delay elements having a combined delay approximately equal to a period of a clock signal, and said generating a delayed signal by passing a received signal through a second number of serially coupled second delay elements are performed for each period of said clock signal.

21. The method according to claim 20, wherein said processing of said vector corresponding to said first number of serially coupled first delay elements, further comprises adjusting said found position of said first positive edge transition in said vector according to at least one previously found position so as to avoid abrupt changes in positions of first positive edge transitions between adjacent periods of said clock signal.

22. The method according to claim 21, wherein adjusting said found position of said first positive edge transition in said vector according to at least one previously found position so as to avoid abrupt changes in positions of first positive edge transitions between adjacent periods of said clock signal, comprises computing a moving average of such first positive edge transitions.

23. The method according to claim 15, wherein said generating a delayed signal by passing a signal through a second number of serially coupled second delay elements, comprises:
providing said signal to a second delay tree having delay branches sequentially configured so as to have increasing numbers of serially coupled second delay elements; and
providing outputs of said branches of said second delay tree to a multiplexer that provides said delayed signal according to information indicative of said first number of said serially coupled first delay elements.

24. An apparatus for generating a compensated percent-of-clock period delayed signal, comprising:
a first delay tree sensitive to reference voltage and temperature variations and having branches receiving and delaying by varying amounts a clock signal relatively insensitive to said reference voltage and said temperature variations as compared to said first delay tree;
a processing circuit capturing outputs of said first delay tree in response to said clock signal so as to indicate a first set of branches of said first delay tree through which a previously generated positive edge of said clock signal has passed through and a second set of branches of said first delay tree through which said previously generated positive edge of said clock signal has not passed through during a period of said clock signal;
a second delay tree similarly sensitive to said reference voltage and said temperature variations as compared to said first delay tree, and having branches receiving and delaying by varying amounts a signal to be delayed; and
a selection circuit selecting an output of one of said branches of said second delay tree to provide a delayed signal compensated for said reference voltage and said temperature variations according to information of said captured outputs of said first delay tree.

25. The apparatus according to claim 24, wherein said branches of said first delay tree are organized sequentially and configured such that each of said branches provides incrementally more delay than a previous branch in sequence.

26. The apparatus according to claim 25, wherein said each of said branches includes incrementally one more delay element than said previous branch in sequence.

27. The apparatus according to claim 25, wherein a first in sequence of said branches of said first delay tree receives said clock signal and delays it through a first delay element having a first delay value to provide a first branch output, and subsequent in sequence of said branches of said first delay tree are coupled to branch outputs of prior in sequence branches and delays signals received from such branch outputs through delay elements having said first delay value to generate branch outputs of said subsequent in sequence branches.

28. The apparatus according to claim 27, wherein said processing circuit comprises a first register having inputs coupled to corresponding outputs of branches of said first delay tree, and enabled by said clock signal.

29. The apparatus according to claim 28, wherein said processing circuit further comprises a second register having inputs coupled to corresponding outputs of said first register, and enabled by said clock signal.

30. The apparatus according to claim 29, wherein said processing circuit further comprises a buffer having an input coupled to said clock signal, and an output providing said clock signal to said second register.

31. The apparatus according to claim 30, wherein said processing circuit further comprises logic that is configured to find a first positive edge transition in said bits of said output of said second register, wherein such first positive edge transition has bits of one logic state on one side of said first positive edge transition and bits of another logic state on an opposite side of said first positive edge transition so as to indicate a branch of said delay tree having an approximately equal delay value as a period of said clock signal.

32. The apparatus according to claim 31, wherein said logic is further configured to adjust a position of said first positive edge transition according to at least one previously found position during a prior period of said clock signal so as to avoid abrupt changes in positions of said first positive edge transitions found between adjacent periods of said clock signal.

33. The apparatus according to claim 32, wherein said logic to adjust said position of said first positive edge transition according to a moving average of previously found positions during prior periods of said clock signal.

34. The apparatus according to claim 33, wherein said selection circuit comprises a multiplexer having inputs coupled to outputs of said second delay tree, and an output providing said delayed signal as selected by information generated by said logic of said processing circuit.

35. The apparatus according to claim 34, wherein said branches of said second delay tree are organized sequentially and configured such that each of said branches provides incremental more delay than a previous branch in sequence.

36. The apparatus according to claim 35, wherein a ratio of delays for corresponding branches of said first and said second delay trees determines a delay that said signal to be delayed is delayed as a percent of said period of said clock signal.

37. An apparatus for generating a compensated percent-of-clock period delayed signal, comprising:
a first circuit generating an output indicative of a number of a first plurality of serially coupled delay elements individually having substantially a first delay value and together providing a combined delay related to a period of a clock signal, wherein said clock signal is relatively insensitive to reference voltage and temperature variations and said number varies according to said reference voltage and said temperature variations, and wherein said first circuit includes a first plurality of delay branches and a first register, said first plurality of delay branches sequentially configured so as to have increasingly larger numbers of delay elements of said first delay value, said first plurality of delay branches including said first plurality of serially coupled delay elements and individually having an output and an input receiving said clock signal, and said first register enabled by said clock signal and having inputs and outputs, said inputs of said first register coupled to corresponding outputs of said first plurality of delay branches such that said outputs of said first register are indicative of said number of said first plurality of serially coupled delay elements; and a second circuit coupled to said first circuit and generating a delayed signal by passing a signal to be delayed through a second plurality of serially coupled delay elements individually having substantially a second delay value and together related in number to said number of said first plurality of serially coupled delay elements.

38. The apparatus according to claim 37, wherein said first circuit further comprises a second register enabled by said clock signal, said second register having inputs and outputs, said inputs of said second register coupled to corresponding outputs of said first register so that said outputs of said second register are as or more accurately indicative of said number of said first plurality of serially coupled delay elements than said outputs of said first register.

39. The apparatus according to claim 38, wherein said first circuit further comprises a buffer having an input and an output, wherein said buffer input is coupled to said clock signal and said buffer output provides said clock signal to enable said second register.

40. The apparatus according to claim 39, wherein said first circuit further comprises delay control logic receiving and processing said outputs of said second register so as to provide information indicative of said number of said first plurality of serially coupled delay elements to said second circuit.

41. A The apparatus according to claim 40, herein said output of said second register defines a vector having bits among which a first positive edge transition is indicated where a first set of said bits on one side of said edge transition are mostly a first logic state and a second set of said bits on an opposite side of said edge transition are mostly a second logic state so that said number of said first plurality of serially coupled delay elements is indicated by a position of said first positive edge transition in said vector.

42. The apparatus according to claim 41, wherein said delay control logic has a first function of finding said position of said first positive edge transition in said vector.

43. The apparatus according to claim 42, wherein said delay control logic has a second function of adjusting said position of said first positive edge transition in said vector according to at least one previously found position so as to avoid abrupt changes in positions of edge transitions for adjacent periods of said clock signal.

44. The apparatus according to claim 43, wherein said delay control logic performs said second function using a moving average technique.

45. The apparatus according to claim 37, wherein said second circuit comprises:

a second plurality of delay branches sequentially configured so as to have increasingly larger numbers of delay elements of said second delay value, said second plurality of delay branches including said second plurality of delay elements and individually having an output and an input receiving said signal to be delayed; and a multiplexer having data inputs, a selector input, and an output, wherein said data inputs of said multiplexer are coupled to corresponding outputs of said second plurality of delay branches, said selector input is coupled to said output of said first circuit, and said output of said multiplexer provides said delayed signal.

46. An apparatus for generating a compensated percent-of-clock period delayed signal, comprising:

a first circuit generating an output indicative of a number of a first plurality of serially coupled delay elements individually having substantially a first delay value and together providing a combined delay related to a period of a clock signal, wherein said clock signal is relatively insensitive to reference voltage and temperature variations and said number varies according to said reference voltage and said temperature variations; and a second circuit coupled to said first circuit and generating a delayed signal by passing a signal to be delayed through a second plurality of serially coupled delay elements individually having substantially a second delay value and together related in number to said number of said first plurality of serially coupled delay elements, wherein said second circuit includes a second plurality of delay branches and a multiplexer, said second plurality of delay branches sequentially configured so as to have increasingly larger numbers of delay elements of said second delay value, said second plurality of delay branches including said second plurality of delay elements and individually having an output and an input receiving said signal to be delayed, and said multiplexer having data inputs, a selector input, and an output, wherein said data inputs of said multiplexer are coupled to corresponding outputs of said second plurality of delay branches, said selector input is coupled to said output of said first circuit, and said output of said multiplexer provides said delayed signal.

47. A method for generating a compensated percent-of-clock period delayed signal, comprising:

determining a first number of serially coupled first delay elements having a combined delay substantially equal to a period of a clock signal, wherein said clock signal is relatively insensitive to reference voltage and temperature variations compared to individual of said serially coupled first delay elements, and said determining includes providing said clock signal to a first delay tree having branches sequentially configured so as to have increasing numbers of serially coupled first delay elements, and providing outputs of said branches of said first delay tree to a first register enabled by said clock signal and having an output indicative of said number of serially coupled first delay elements; and generating a delayed signal by passing a signal through a second number of serially coupled second delay elements, wherein said second number is determined from said first number and said delayed signal is delayed from said signal by a percentage of said period of said clock signal according to values of said first number, said second number, said first delay elements, and said second delay elements.

48. The method according to claim 47, wherein said determining a first number of serially coupled first delay elements having a combined delay approximately equal to a period of a clock signal, further comprises providing said output of said first register to a second register enabled by said clock signal and having an output generally more accurately indicative of said number of serially coupled first delay elements than said output of said first register.

49. A method for generating a compensated percent-of-clock period delayed signal, comprising:

determining a first number of serially coupled first delay elements having a combined delay substantially equal to a period of a clock signal, wherein said clock signal is relatively insensitive to reference voltage and temperature variations compared to individual of said serially coupled first delay elements; and generating a delayed signal by passing a signal through a second number of serially coupled second delay elements, wherein said second number is determined from said first number by processing a vector corresponding to said first number and having bits among which a first positive edge transition is indicated where a first set of said bits on one side of said edge transition are mostly a first logic state and a second set of said bits on an opposite side of said edge transition are mostly a second logic state so that said first number is indicated by a position of said first positive edge transition in said vector, and said delayed signal is delayed from said signal by a percentage of said period of said clock signal according to values of said first number, said second number, said first delay elements, and said second delay elements.

50. The method according to claim 49, wherein said processing of said vector corresponding to said first number of serially coupled first delay elements, comprises finding said position of said first positive edge transition in said vector.

51. The method according to claim 50, wherein said determining a first number of serially coupled first delay elements having a combined delay approximately equal to a period of a clock signal, and said generating a delayed signal by passing a received signal through a second number of serially coupled second delay elements are performed for each period of said clock signal.

52. The method according to claim 51, wherein sad processing of said vector corresponding to said first number of serially coupled first delay elements, further comprises adjusting said found position of said first positive edge transition in said vector according to at least one previously found position so as to avoid abrupt changes in positions of first positive edge transitions between adjacent periods of said clock signal.

53. The method according to claim 52, wherein adjusting said found position of said first positive edge transition in said vector according to at least one previously found position so as to avoid abrupt changes in positions of first positive edge transitions between adjacent periods of said clock signal, comprises computing a moving average of such first positive edge transitions.

54. A method for generating a compensated percent-of-clock period delayed signal, comprising:

determining a first number of serially coupled first delay elements having a combined delay substantially equal to a period of a clock signal, wherein said clock signal is relatively insensitive to reference voltage and temperature variations compared to individual of said serially coupled first delay elements; and generating a delayed signal by passing a signal through a second number of serially coupled second delay elements, wherein said second number is determined from said first number and said delayed signal is delayed from said signal by a percentage of said period of said clock signal according to values of said first number, said second number, said first delay elements, and said second delay elements, and said generating includes providing said signal to a second delay tree having delay branches sequentially configured so as to have increasing numbers of serially coupled second delay elements and providing outputs of said branches of said second delay tree to a multiplexer that provides said delayed signal according to information indicative of said first number of said serially coupled first delay elements.

* * * * *